(12) United States Patent
Yokoyama

(10) Patent No.: US 6,172,547 B1
(45) Date of Patent: *Jan. 9, 2001

(54) SEMICONDUCTOR INTEGRATED CIRCUIT CAPABLE OF DRIVING LARGE LOADS WITHIN ITS INTERNAL CORE AREA

(75) Inventor: Moto Yokoyama, Hamamatsu (JP)

(73) Assignee: Yamaha Corporation, Hamamatsu (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/811,275

(22) Filed: Mar. 4, 1997

(30) Foreign Application Priority Data

Mar. 5, 1996 (JP) .................................. 8-047741

(51) Int. Cl.[7] ......................................... H03K 1/04
(52) U.S. Cl. ..................... 327/293; 327/297; 327/298; 327/565
(58) Field of Search ................................ 327/291, 293, 327/297, 298, 564, 565, 566

(56) References Cited

U.S. PATENT DOCUMENTS

| 4,278,897 | * | 7/1981 | Ohno et al. | 327/565 |
| 4,488,267 | * | 12/1984 | Harrison | 327/565 |
| 5,140,184 | * | 8/1992 | Hamamoto et al. | 327/565 |
| 5,172,330 | * | 12/1992 | Watanabe et al. | 327/565 |
| 5,196,740 | * | 3/1993 | Austin | 327/566 |
| 5,739,718 | * | 4/1998 | Chevroulet | 327/566 |

* cited by examiner

Primary Examiner—Terry D. Cunningham
(74) Attorney, Agent, or Firm—Pillsbury Madison & Sutro LLP

(57) ABSTRACT

A semiconductor integrated circuit is provided which has an internal core area in which a first set of transistors are regularly arranged, and a peripheral area in which a second set of transistors are arranged to constitute input/output circuits. In this semiconductor integrated circuit, the transistors arranged in the peripheral area include a plurality of transistors that are not used to constitute the input/output circuits, and these unused transistors constitute at least one driver for driving at least one of circuits constituted by the transistors arranged in the internal core area.

3 Claims, 5 Drawing Sheets

SEMICONDUCTOR INTEGRATED CIRCUIT CAPABLE OF DRIVING LARGE LOADS WITHIN ITS INTERNAL CORE AREA

BACKGROUND OF THE INVENTION

1. Field of the Invention

The present invention relates to a semiconductor integrated circuit, such as a gate array, suited for few-of-a kind production in which a wide variety of products are produced in a small quantity for each kind.

2. Prior Art

A process of manufacturing a semiconductor integrated circuit is roughly divided into a diffusion process for forming elements, such as transistors and resistors, on a semiconductor wafer, and a wiring or metallizing process for forming a wiring pattern for connecting these elements with each other. Gate arrays are manufactured by employing the same diffusion process regardless of different kinds of products, and then effecting the wiring process that differs from one product to another so as to produce each kind of product. Namely, in order to manufacture individual kinds of gate arrays, semiconductor wafers (base wafers), each having a multiplicity of transistors disposed thereon, are preliminarily prepared and stored, and, when a certain kind of product is ordered, a wiring pattern required for this kind is formed on the base wafer, so as to provide a semiconductor wafer on which are formed circuits corresponding to the desired kind of product.

The base wafer is divided into a multiplicity of chips that constitute a gate-array device. Although the arrangement of the chips varies depending upon the kind of the product, many gate-array chips are divided into an internal core area and a peripheral area. The internal core area is an area in a which a multiplicity of transistors are arranged in matrix, and the transistors in this area are used to provide a circuit for the desired kind of product, for example, a decoding circuit when a decoding LSI is produced as the desired product. Recent advances in the technology of manufacturing semiconductor devices have enabled a great number of fine or minute transistors to be incorporated in one chip, which leads to the development of a gate array having an internal core area consisting of several tens of thousands of transistors. The peripheral area, on the other hand, is an area that surrounds the internal core area, and transistors in this peripheral area are used to provide input and output circuits for receiving and transmitting signals between the circuit constituted by the transistors in the internal core area and an external device or devices located outside the gate array.

To enable the gate array to perform high-speed operations, the transistors constituting the internal core area need to have increased driving force, which requires an increase in the size (e.g., channel width in the case of a MOS transistor) of each of the transistors. If the size of each transistor is increased, however, the size of the internal core area is accordingly increased, resulting in an increase in the cost per chip. There is also a limit to the manufacturing technology for increasing the chip size. Further, if the driving force of each transistor is increased, the current flowing upon switching of the transistor increases, thereby causing problems such as increased power consumption and reduced lifetime of the wiring. In view of these situations, most of large-scale gate arrays are currently designed by taking account of an average load per gate in a general digital circuit, so that the internal core area consists of transistors having the minimum size required for driving such a load.

The input and output circuits constituted by the transistors of the peripheral area, on the other hand, function to transmit output signals to an external device, and transmit input signals from the external device to respective points of the internal core area; therefore, these transistors are required to produce large driving force. To this end, a general gate array is constructed such that a sufficiently large number or size of transistors are provided in the peripheral area.

Where a large-scale circuit is provided by the gate array, the circuit may be designed such that loads collectively forming a large load are driven by a common control signal. One example is the case where numerous flip-flops are driven by a common clock signal. In this case, a wiring system for transmitting the clock signal involves a large load capacity including the capacity of the wiring itself, as well as the input capacity (gate capacity) of clock terminals of the numerous flip-flops.

If no measures are taken to deal with such a large load capacity, the rise time and fall time of waves of the clock signal or the like which propagate through the wiring system may be extremely prolonged, or the delay time may be extremely increased, thereby possibly causing troubles in the operating timing of the circuit or deterioration of the electric performance (such as operating frequency). In some circuits, a large skew should not arise in clock signals supplied to the respective flip-flops, and a suitable means or device is needed for preventing occurrence of this situation. Where such a large load is to be driven in a conventional gate array, therefore, a plurality of transistors in the internal core area are connected in parallel with each other to provide a driver having a large driving force, and clock signals or the like are supplied to respective points in the circuit through this driver.

Since each of the transistors in the internal core area of the gate array generally has only a small driving force as described above, a considerably large number of transistors need to be used to provide a driver having a large driving force. In the case where the gate array provides a large-scale circuit that inherently requires a large number of transistors, however, it may be impossible to prepare the transistors for providing the driver through which the clock signals are transmitted.

SUMMARY OF THE INVENTION

It is therefore an object of the invention to provide a semiconductor integrated circuit that is capable of driving a large load within its internal core area, without sacrificing transistors in the internal core area.

To attain the above object, the present invention provides a semiconductor integrated circuit having an internal core area in which a first set of transistors are regularly arranged to constitute at least one circuit, and a peripheral area in which a second set of transistors are arranged to constitute input/output circuits, wherein the second set of transistors arranged in the peripheral area include a plurality of transistors that are not used to constitute the input/output circuits, the plurality of transistors constituting at least one driver for driving at least one of circuits constituted by the first set of transistors arranged in the internal core area.

According to the present invention, the driver(s) is/are constituted by the transistors of the peripheral area that are not used to provide the input/output circuits, thus saving the transistors of the internal core area that would be otherwise used to provide the driver. Since the peripheral area is generally provided with transistors having larger driving force than those in the internal core area, these transistors in the peripheral area can provide a driver capable of driving a large load.

In a typical construction of the semiconductor integrated circuit according to the invention, the peripheral area includes a first area in which a plurality of first transistors are arranged to constitute output buffers for transmitting at least one signal from the internal core area to an external device, and a second area in which a plurality of second transistors and a plurality of third transistors are arranged, respectively, to constitute input buffers for transmitting at least one signal from the external device to the internal core area and pre-drivers for driving the output buffers, the at least one driver being constituted by transistors of the first, second and third transistors that are not used to constitute the output buffers, the input buffers, and the pre-drivers.

In a preferred application of the semiconductor integrated circuit according to the invention, the at least one driver amplifies and transmits a clock signal to at least one of circuits constituted by the first set of transistors arranged in the internal core area.

For example, the at least one of the circuits constituted by the first set of transistors arranged in the internal core area comprises a multiplicity of circuits, the at least one driver amplifies and transmits a clock signal to the multiplicity of circuits.

In a preferred embodiment of the invention, the at least one of the circuits constituted by the first set of transistors arranged in the internal core area comprises a multiplicity of flip-flops, the at least one driver comprising a plurality of first drivers, and a plurality of second drivers, the second drivers amplifying and transmitting a clock signal to the first drivers, the first drivers further amplifying and transmitting the amplified clock signal to the multiplicity of flip-flops.

The above and other objects, features, and advantages of the invention will be more apparent from the following detailed description taken in conjunction with the accompanying drawings.

DETAILED DESCRIPTION

To further clarify the concept of the invention, there will be described preferred embodiments of the invention.

Figure 1:
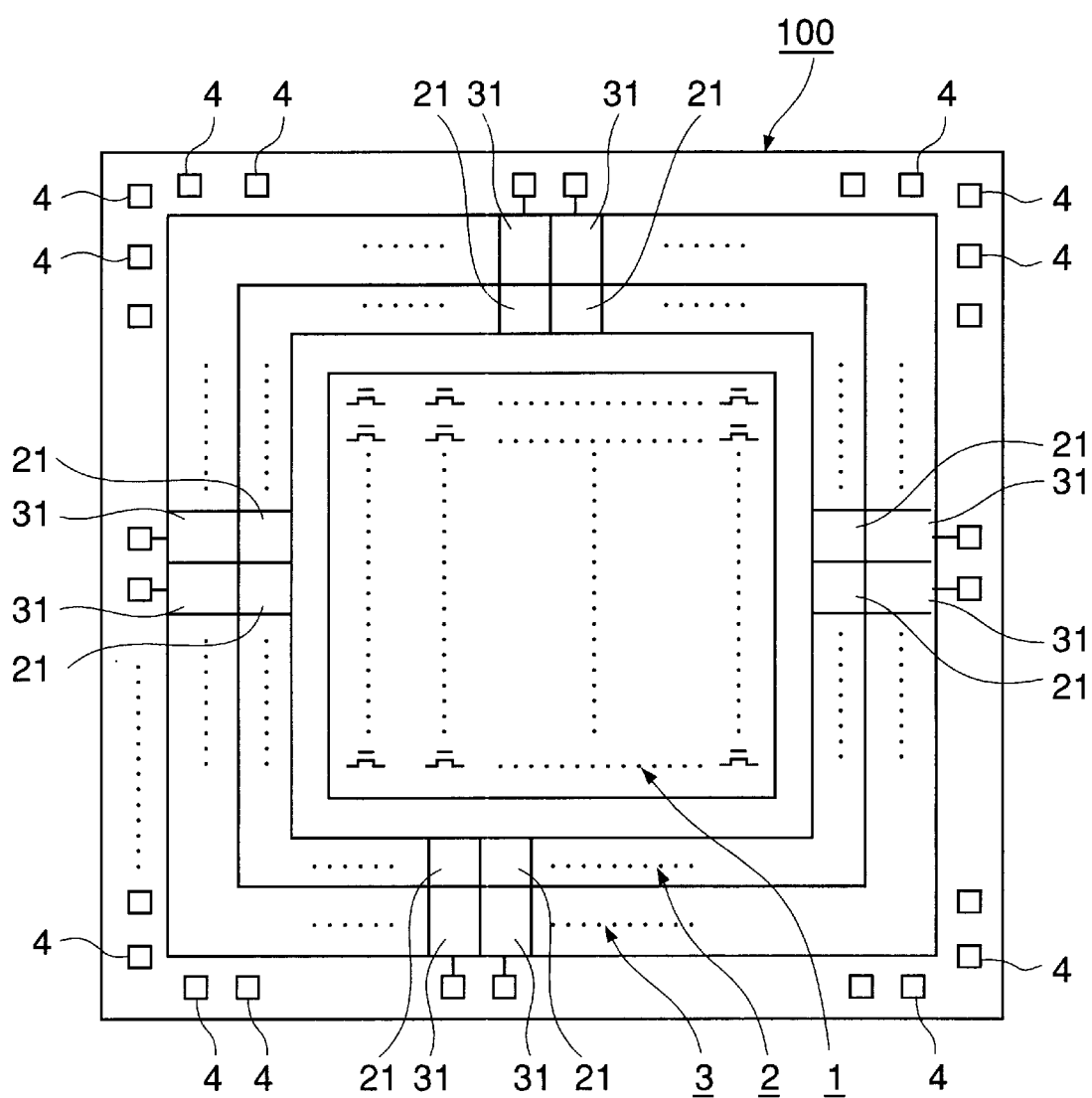
FIG. 1 is a view showing the chip layout of a CMOS gate array constructed according to one embodiment of the invention.

FIG. 1 shows the layout of a chip 100 of a CMOS gate array constructed according to one embodiment of the invention. As shown in FIG. 1, an internal core area 1, in which a multiplicity of transistors are arranged in the longitudinal and lateral directions, is formed in a central portion of the chip 100. This internal core area 1 is surrounded by a pre-driver area 2, which in turn is surrounded by an I/O area 3. These pre-driver area 2 and I/O area 3 correspond to the peripheral area as described above. In addition, a multiplicity of bonding pads 4, 4, . . . are disposed outside the I/O area 3.

The I/O area 3 is divided into blocks 31, 31, . . . , and the number of these blocks 31 is equivalent to the total number of input/output circuits that can be provided by this gate array. The pre-driver area 2 is constructed in the same way, namely, is divided into blocks 21, 21, . . . that correspond to the respective blocks 31, 31, . . . of the I/O area 3.

Figure 2:
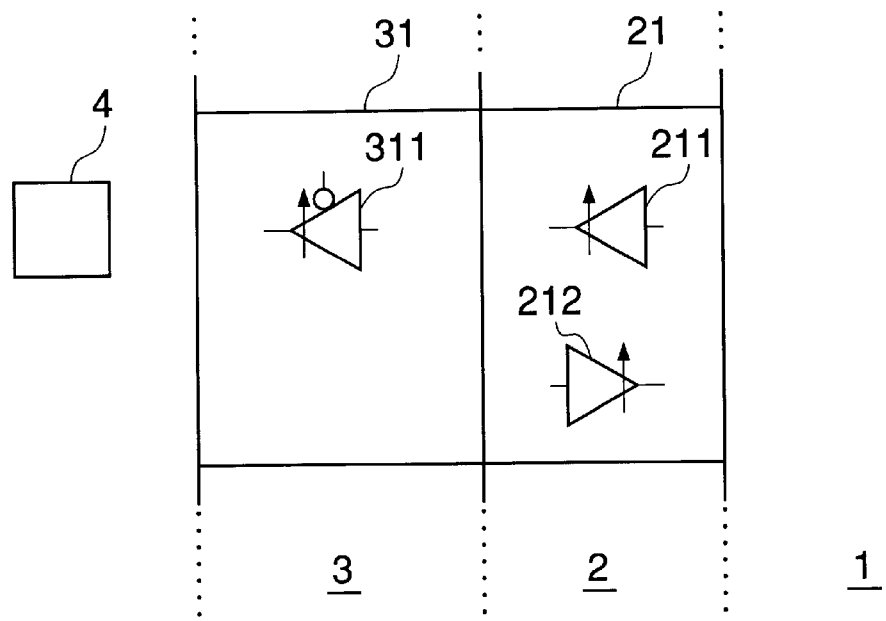
FIG. 2 is a view showing the construction of a block of a peripheral area of a chip of a CMOS gate array in general.

FIG. 2 shows the construction of one of the blocks 21 and a corresponding one of the blocks 31 in a chip of a CMOS gate array in general. The block 31 has a group of transistors 311 constituting an output buffer that outputs a signal to an external device. The block 21 has a group of transistors 212 constituting an input buffer that transmits an input signal from the external device to the internal core area 1, and a group of transistors 211 constituting a pre-driver that drives the output buffer. Which type of circuit is constituted by these blocks 21 and 31 depends on a wiring pattern provided on these blocks 21, 31. The number of transistors included in each buffer can be also selected depending upon the wiring pattern. Thus, each of the input buffer, output buffer and pre-driver may have different driving forces by changing the wiring pattern.

Figure 3:
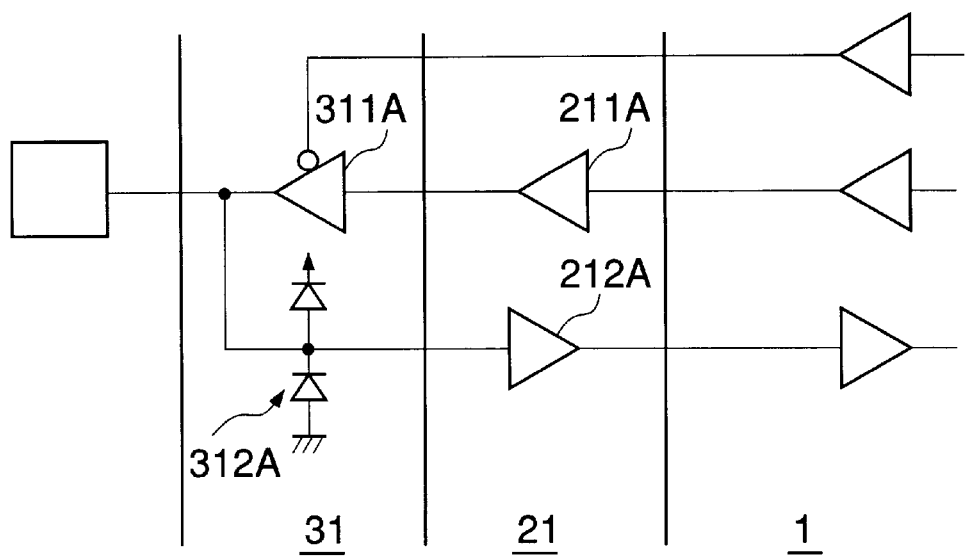
FIG. 3 is a view showing the construction of an input/output circuit in a chip of a CMOS gate array in general.

FIG. 3 shows an example of a chip of a CMOS gate arrange in general in which all of the transistors included in the blocks 21 and 31 are used to provide a circuit serving both the input and output functions. In FIG. 3, reference numerals 211A, 311A and 212A denote a pre-driver, an output buffer, and an input buffer, respectively. Reference numeral 312A denotes a parasitic diode which is disposed between a drain of each transistor of the output buffer 311A and a substrate, so as to provide a protective circuit for protecting a gate of the input buffer 212A from electrostatic breakdown. With the exception of the above case where all of the transistors in the blocks 21 and 31 are used for the input and output of signals, some transistors become redundant if the blocks 21 and 31 are used only for either the input or output of signals. Also, the blocks 21, 21, . . . and blocks 31, 31, . . . provided on the chip generally include some blocks that are not used for the input nor for the output. In the present embodiment, such unused transistors in the peripheral area (blocks 21, 31) are utilized to provide a driver for driving a large load in the internal core area 1.

Figure 4:
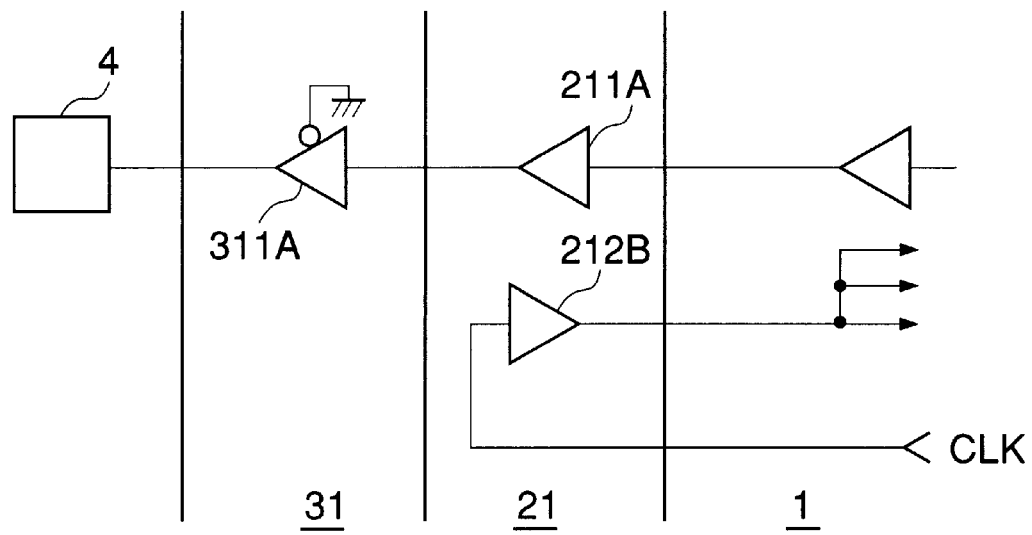
FIG. 4 is a view showing an example of a driver provided in the embodiment of FIG. 1.
Figure 5:
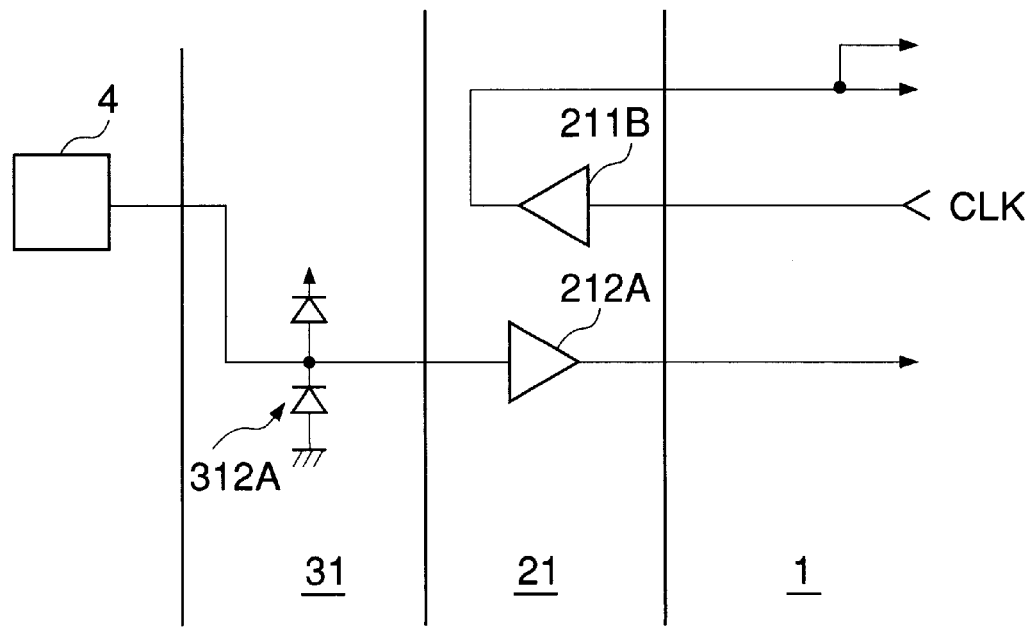
FIG. 5 is a view showing another example of a driver provided in the embodiment of FIG. 1.
Figure 6:
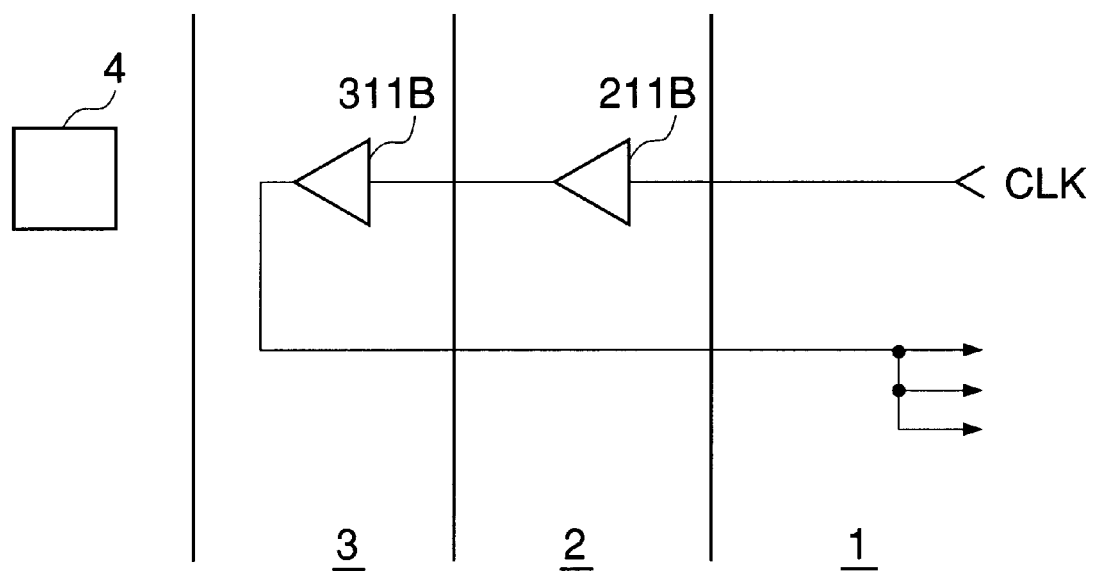
FIG. 6 is a view showing a further example of a driver provided in the embodiment of FIG. 1.

FIGS. 4–6 show examples of the driver constituted by these unused transistors, according to the present invention.

FIG. 4 shows an example in which the blocks 21 and 31 are used for the output of signals. In this example, while the pre-driver 211A and output buffer 311A are constructed to output a signal from the internal core area 1 to the external device, the group of transistors 212 for providing an input buffer remains unused. Thus, the remaining transistors 212 are suitably wired so as to provide a driver 212B, and a clock signal CLK received from the internal core area 1 is supplied to flip-flops (not shown) or the like in the internal core area 1 through this driver 212B.

FIG. 5 shows another example in which the blocks 21 and 31 are used only for the input of signals. In this example, while the input buffer 212A is constructed to transmit an input signal from the external device into the internal core area 1, the groups of transistors 211 and 311 for providing a pre-driver and an output buffer remain unused. Thus, the remaining transistors 211 are suitably wired so as to provide a driver 211B for amplifying a clock signal CLK (received) from the internal core area 1.

FIG. 6 shows a further example in which the blocks 21 and 31 are not used for the input nor output of signals. In this example, the groups of transistors 211 and 311 are suitably wired so as to provide a two-stage driver consisting of drivers 211B and 311B that are cascaded or connected in series. In operation, a clock signal CLK from the internal core area 1 successively passes through these drivers 211B and 311B and return to the internal core area 1. In this arrangement, the clock signal CLK is supplied to the internal core area 1 through the transistors designed for an output buffer and thus having large driving force; therefore, even if the internal core area 1 has numerous flip-flops or the like that receive the clock signal CLK, the drivers 211B, 311B are able to drive these flip-flops or the like at a sufficiently high speed.

In the above examples, the transistors that remain unused in the peripheral area are used to provide a driver or drivers for amplifying clock signals, thus eliminating the need to use transistors in the internal core area for this purpose.

Figure 7:
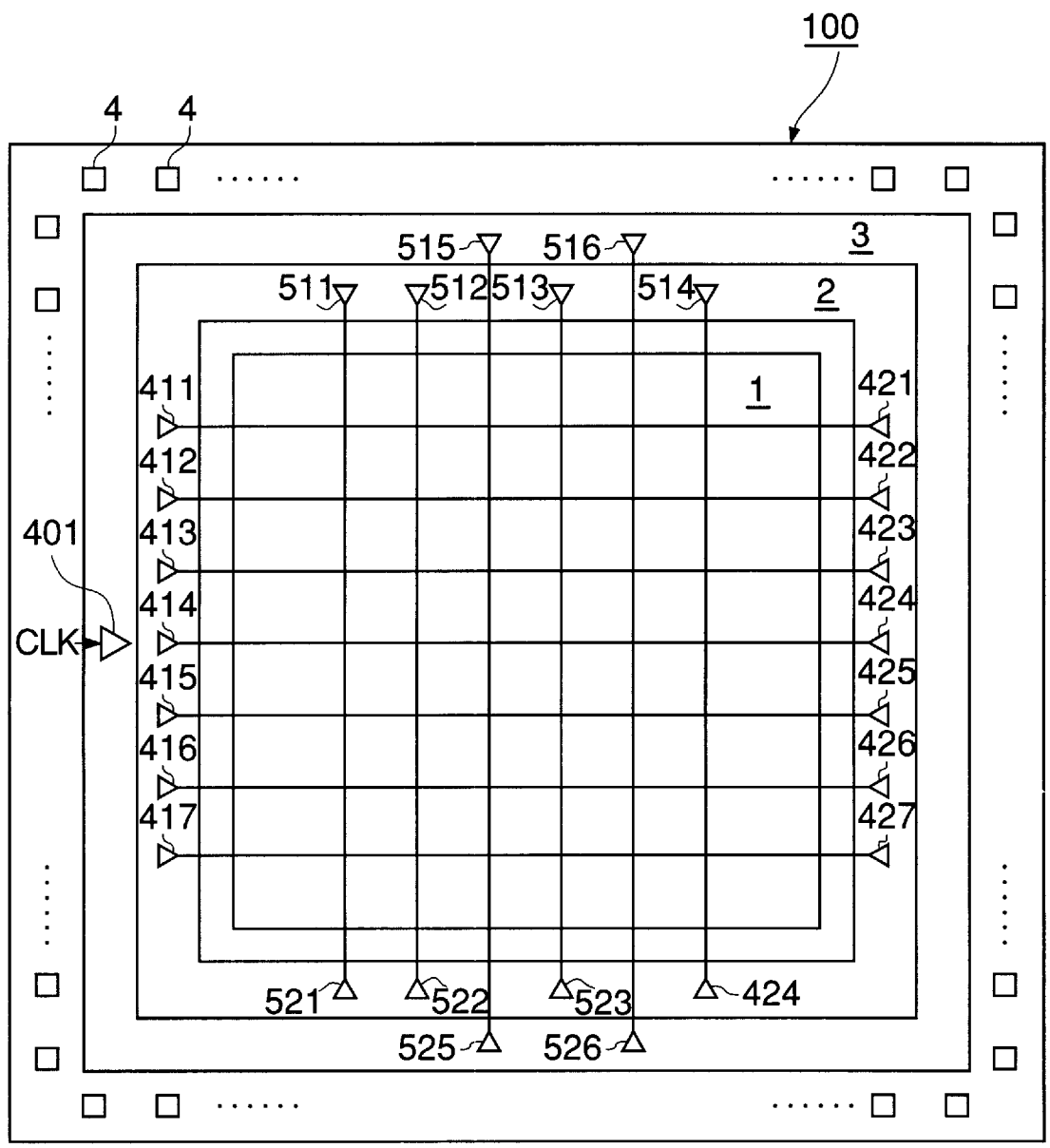
FIG. 7 is a view showing a wiring system for transmitting clock signals in a CMOS gate array constructed according to another embodiment of the invention.

A circuitry may be considered in which a considerably large number of flip-flops are simultaneously driven by a common clock signal. FIG. 7 shows a circuitry suitably employed in this situation, according to another embodiment of the invention. In this embodiment, transistors in a pre-driver area 2 are utilized to provide drivers 411–477 located on the left side of the internal core area 1 and drivers 421–427 located on the right side of the core area 1, and a first set of wires are formed sideways to connect output terminals of the laterally opposed drivers. Also, transistors in the pre-driver 2 and an I/O area 3 are utilized to provide drivers 511–516 located on the upper side of the internal core area 1 and drivers 521–526 on the lower side of the core area 1, and a second set of wires are formed in the longitudinal direction to connect output terminals of the longitudinally opposed drivers. While the first set of lateral wires and the second set of longitudinal wires are disposed in different layers of the internal core area 1, through-holes are formed at intersections of these lateral and longitudinal wires. The first set of lateral wires are connected to the second set of longitudinal wires through these through-holes, so as to provide a mesh-like wiring that covers the internal core area 1. The internal core area 1 incorporates a multiplicity of flip-flops (not shown) to be driven simultaneously, and clock terminals of these flip-flops are connected to this mesh-like wiring. A clock signal CLK is amplified by a driver 401 constituted by transistors in the I/O area 3. An output signal of this driver 401 is then supplied to the drivers 411–417, 421–427, 511–516 and 521–526, and the mesh-like wiring covering the internal core area 1 is driven by these drivers, so as to drive the respective flip-flops.

As explained above, according to the present invention, the transistors that remain unused in the peripheral area are used to provide drivers for driving a large load present in the internal core area, thus saving transistors in the internal core area that would be otherwise used for the same purpose.

While preferred embodiments of the invention have been described above, it is to be understood that the present invention is not limited to details of these embodiments, but may be embodied with various other changes, modifications and improvements thereof, without departing from the scope of the invention.

What is claimed is:

1. A semiconductor integrated circuit having an internal core area in which a first set of transistors are arranged in longitudinal and lateral directions to constitute at least one circuit, and a peripheral area in which a second set of transistors, having driving force larger than said first set of transistors, are arranged, the second set of transistors including a first group of transistors which serve as input/output circuits for receiving and transmitting signals between the at least one circuit and an external device located outside the semiconductor integrated circuit, wherein said second set of transistors arranged in said peripheral area include a second group of transistors that are not used to constitute said input/output circuits, said second group of transistors constituting at least one driver for amplifying a clock signal outputted from said internal core area and outputting the amplified clock signal to at least one of the circuits constituted by said first set of transistors arranged in said internal core area, and wherein said peripheral area includes a first area in which said first group of transistors constitute output buffers for transmitting at least one signal from said internal core area to the external device, and a second area in which said first group of transistors constitute input buffers for transmitting at least one signal from said external device to said internal core area and pre-drivers for driving said output buffers.

2. A semiconductor integrated circuit as claimed in claim 1, wherein said at least one of said circuits constituted by said first set of transistors arranged in said internal core area comprises a multiplicity of circuits, said at least one driver amplifies and transmits a clock signal to said multiplicity of circuits.

3. A semiconductor integrated circuit as claimed in claim 1, wherein said at least one of said circuits constituted by said first set of transistors arranged in said internal core area comprises a multiplicity of flip-flops, said at least one driver comprising a plurality of first drivers, and a plurality of second drivers, said second drivers amplifying and transmitting a clock signal to said first drivers, said first drivers further amplifying and transmitting the amplified clock signal to said multiplicity of flip-flops.

* * * * *